US011009805B2

(12) United States Patent
Muto

(10) Patent No.: US 11,009,805 B2
(45) Date of Patent: May 18, 2021

(54) PWM OUTPUTTING CIRCUIT AND IMAGE FORMING APPARATUS HAVING THE SAME

(71) Applicant: CANON KABUSHIKI KAISHA, Tokyo (JP)

(72) Inventor: Hiroyuki Muto, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/890,061

(22) Filed: Jun. 2, 2020

(65) Prior Publication Data

US 2020/0387078 A1  Dec. 10, 2020

(30) Foreign Application Priority Data

Jun. 5, 2019  (JP) .............................. JP2019-105610

(51) Int. Cl.

| G03G 15/00 | (2006.01) |
|---|---|
| G06K 15/00 | (2006.01) |
| H03K 3/00 | (2006.01) |
| G03G 15/043 | (2006.01) |
| H03K 3/037 | (2006.01) |
| G03G 15/04 | (2006.01) |

(Continued)

(52) U.S. Cl.
CPC ..... *G03G 15/043* (2013.01); *G03G 15/04072* (2013.01); *G06K 15/1204* (2013.01); *H03K 3/037* (2013.01); *H03K 7/08* (2013.01)

(58) Field of Classification Search
CPC ........... G03G 15/043; G03G 15/04072; G03G 2215/0404; G06K 15/1204; G06K 15/1228; G06K 15/14; H04N 1/40037; H04N 1/4056; H03K 3/037; H03K 7/08
USPC .................... 399/51, 220; 347/237, 247, 252
See application file for complete search history.

(56) References Cited

U.S. PATENT DOCUMENTS

| 4,897,734 A | * | 1/1990 | Sato ..................... | H04N 1/4056 |
|---|---|---|---|---|
| | | | | 332/109 |
| 5,638,016 A | * | 6/1997 | Eitrheim .............. | H03K 5/1565 |
| | | | | 327/175 |

(Continued)

FOREIGN PATENT DOCUMENTS

| JP | 02153765 A | * | 6/1990 | ........... H04N 1/4056 |
|---|---|---|---|---|
| JP | 11196269 A | * | 7/1999 | |

(Continued)

*Primary Examiner* — Robert B Beatty
(74) *Attorney, Agent, or Firm* — Rossi, Kimms & McDowell LLP

(57) ABSTRACT

This invention provide a PWM outputting circuit that, from pattern data represented by a plurality of bits representing a pulse width, generates a pulse width modulation signal, wherein the circuit comprises a multi-phase-clock generating circuit which generates a multi-phase clock which is a plurality of clocks of mutually different phases; an edge-pulse generating circuit which, from the pattern data that is inputted, detects a bit position of a rising-edge and a bit position of a falling-edge in the pulse width modulation signal, and generates a rising-edge-pulse and a falling-edge-pulse based on the detection; and an SR latch circuit which, by the rising-edge-pulse being inputted to a set terminal and the falling-edge-pulse being inputted to a reset terminal, generates and outputs the pulse width modulation signal.

10 Claims, 14 Drawing Sheets

(51) Int. Cl.
 *H03K 7/08* (2006.01)
 *G06K 15/12* (2006.01)

(56) References Cited

U.S. PATENT DOCUMENTS

| | | | | |
|---|---|---|---|---|
| 6,154,246 A | * | 11/2000 | Ogasawara | G06K 15/1219 |
| | | | | 347/250 |
| 6,271,868 B1 | * | 8/2001 | Kashihara | G03G 15/011 |
| | | | | 347/115 |
| 9,935,624 B2 | | 4/2018 | Takeda | |
| 2002/0150163 A1 | * | 10/2002 | Kawasaki | H04N 1/4056 |
| | | | | 375/240.17 |
| 2009/0296805 A1 | * | 12/2009 | Takahashi | G06F 1/025 |
| | | | | 375/238 |
| 2014/0183335 A1 | * | 7/2014 | Yamazaki | H04N 5/378 |
| | | | | 250/208.1 |
| 2017/0331973 A1 | * | 11/2017 | Takeda | H04N 1/053 |
| 2018/0017784 A1 | * | 1/2018 | Kamei | G06K 15/1204 |

FOREIGN PATENT DOCUMENTS

| | | |
|---|---|---|
| JP | 5491454 B2 | 5/2014 |
| JP | 2017038142 A | 2/2017 |

* cited by examiner

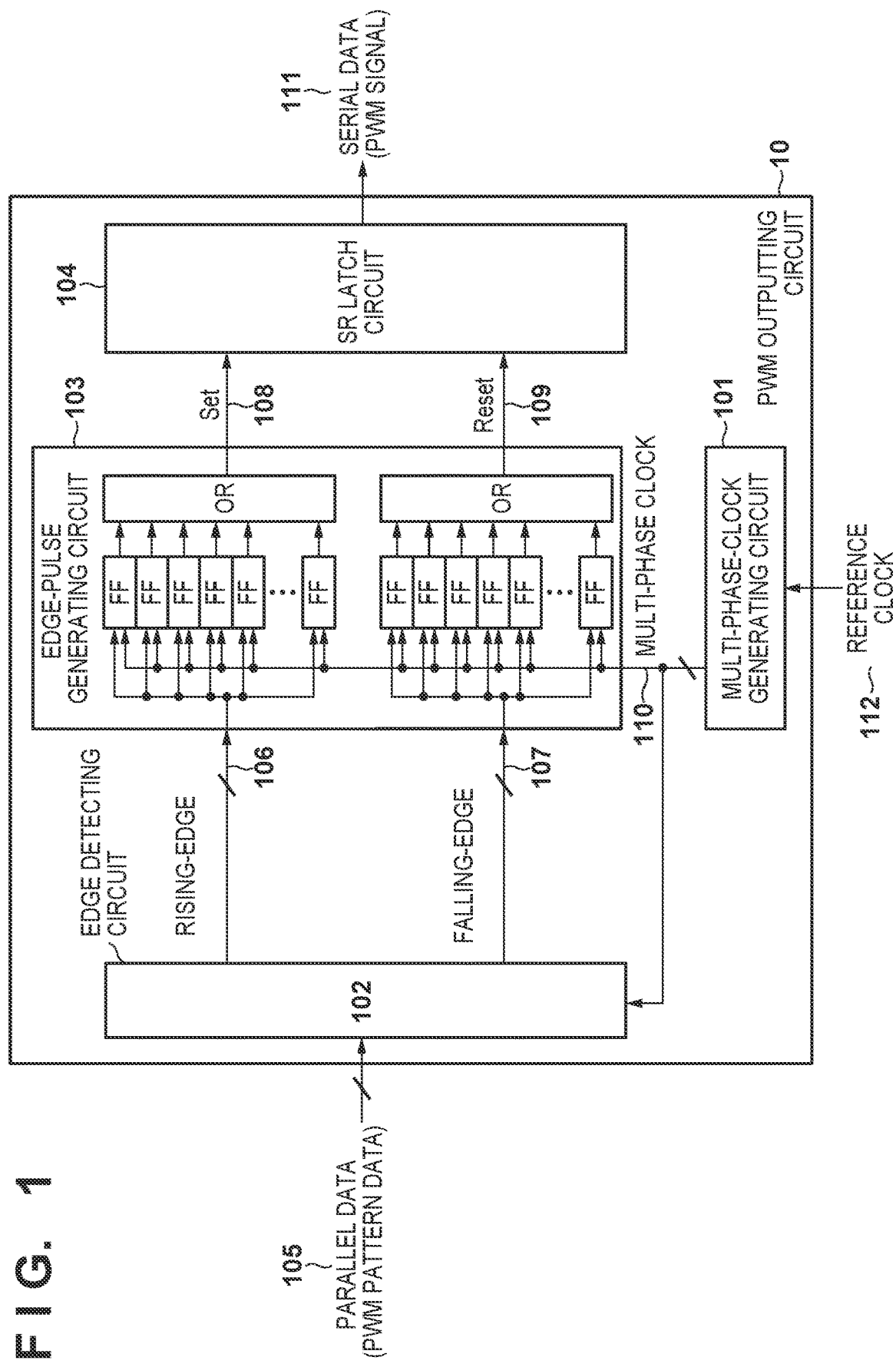

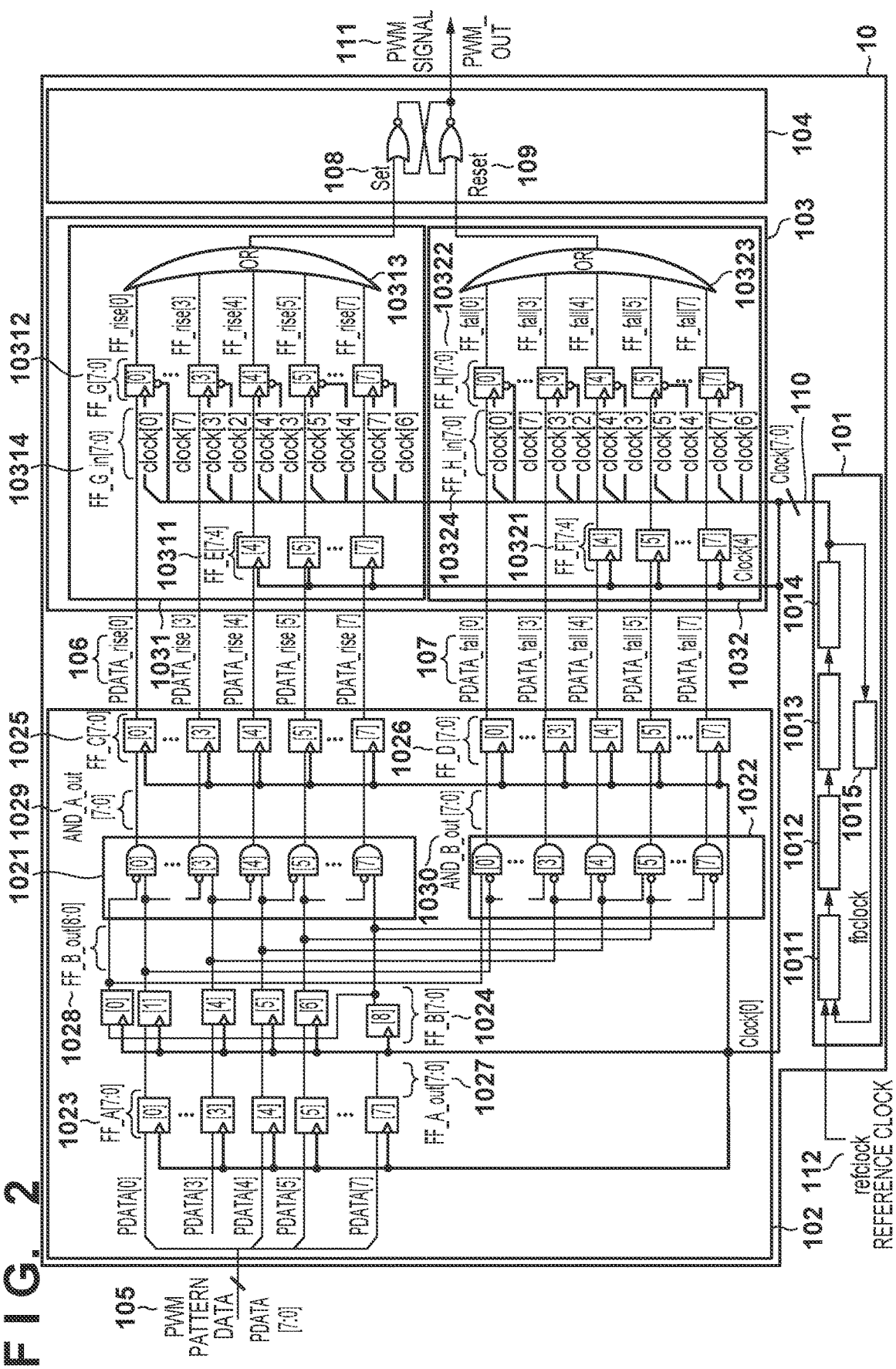

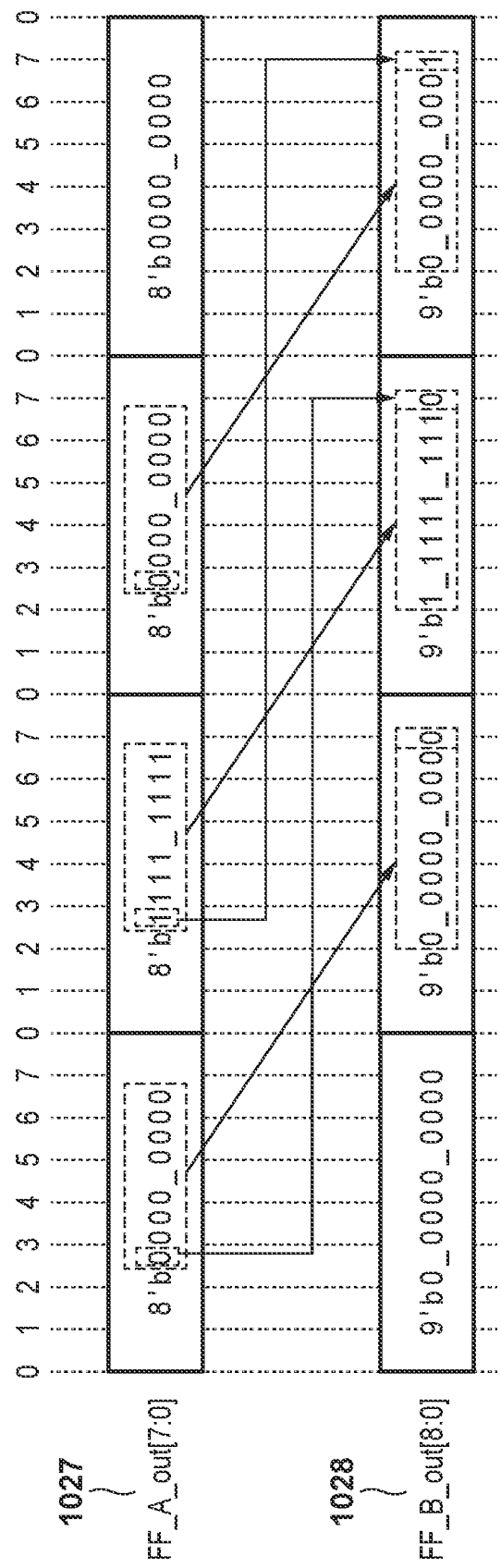

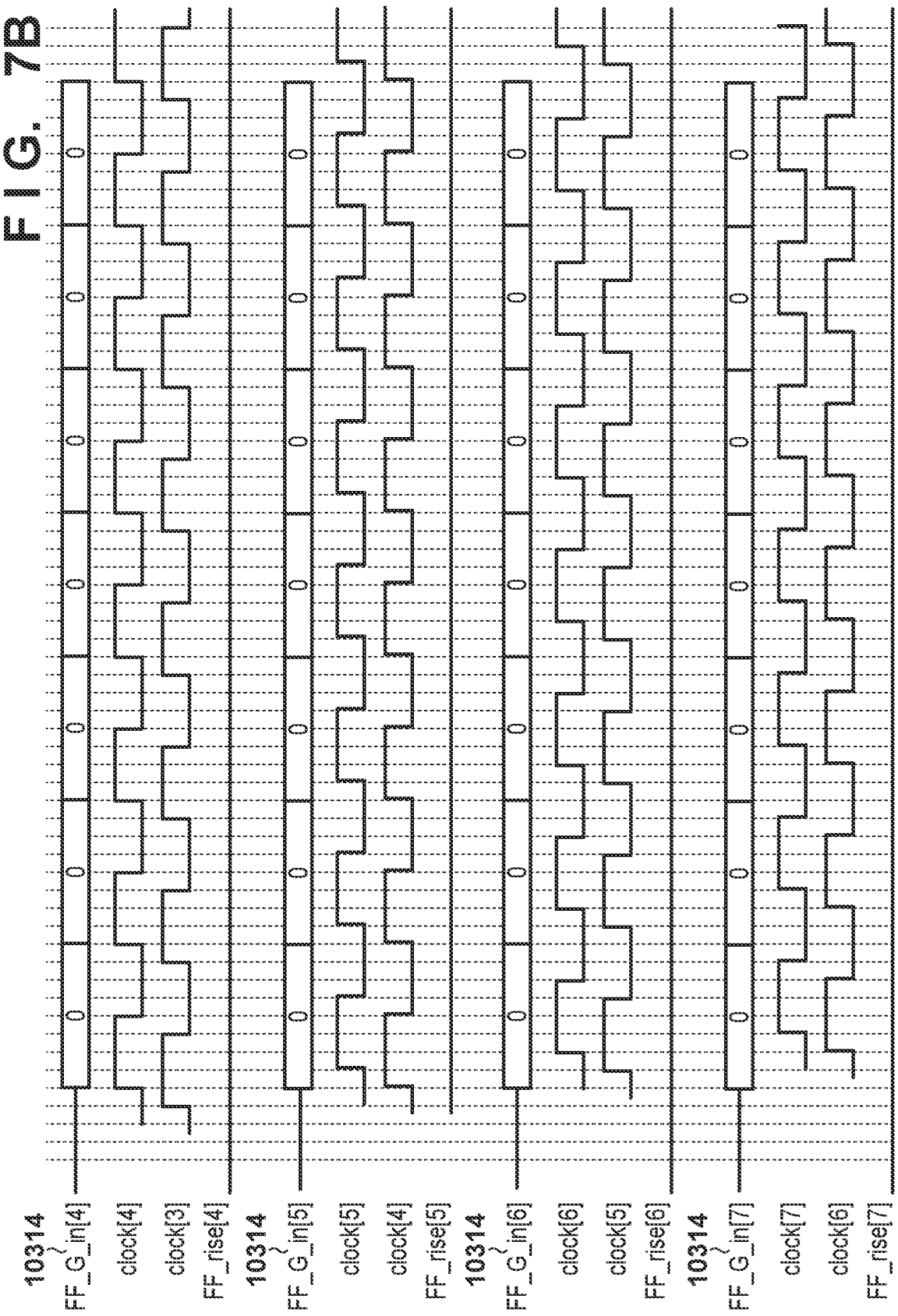

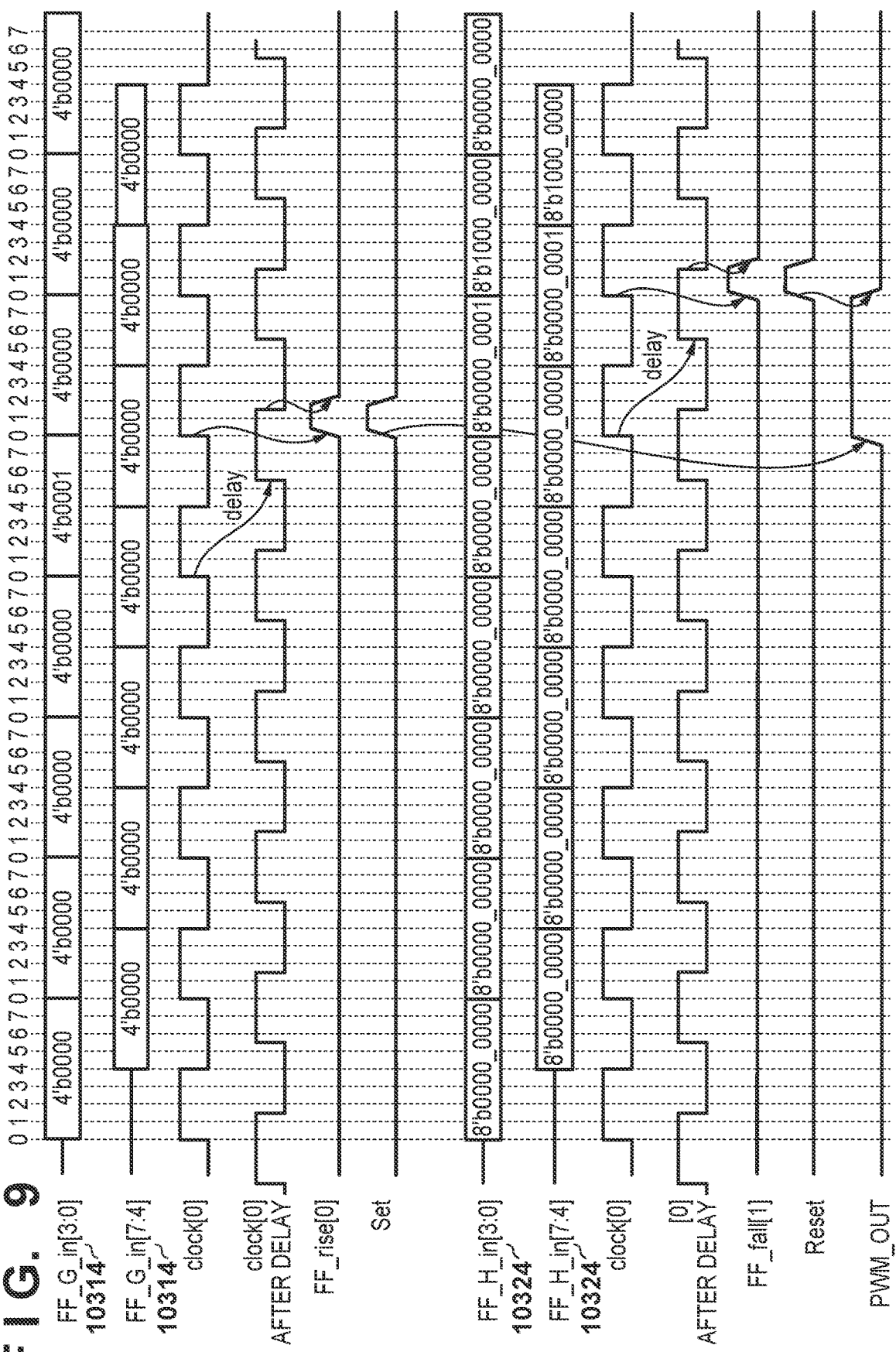

EXAMPLE OF 4 INPUT XOR CIRCUIT

EXAMPLE OF 4 INPUT OR CIRCUIT

PWM OUTPUTTING CIRCUIT AND IMAGE FORMING APPARATUS HAVING THE SAME

BACKGROUND OF THE INVENTION

Field of the Invention

The present invention relates to a technique for generating a pulse width modulation signal.

Description of the Related Art

An image forming apparatus that uses electrophotography has a light scanning apparatus that irradiates and exposes a uniformly charged photosensitive body with a light beam corresponding to image data. The image forming apparatus forms an image on a recording sheet through the formation of an electrostatic latent image on the photosensitive body by the light scanning apparatus, a developing process, and transferring and fixing with respect to the recording sheet.

This light beam is generated by driving the semiconductor laser element in accordance with a PWM signal (Pulse Width Modulation signal) generated from the image data. Then, an image resolution is determined in accordance with a time resolution indicated by the PWM signal (pulse width, controllable fineness of a pulse position).

There is an existing need to increase the image resolution, for this reason, circuit technology relating to increasing the resolution of a PWM signal has been proposed. For example, without using a high-speed clock, by using a plurality of low-speed clocks having mutually different phases (hereinafter, a multi-phase clock), PWM circuit technology that enables high resolution to be realized even in an old generation semiconductor process for which a manufacturing cost is relatively inexpensive has been proposed.

Meanwhile, a PWM signal is generated by performing parallel-to-serial conversion processing on image data, but in the existing technical field of high-speed serial transmission represented by SERDES (SERializer/DESerializer), parallel-to-serial conversion circuit technology that uses a multi-phase clock in order to increase the speed of data transfer has been proposed.

Japanese Patent Laid-Open No. 2017-38142 discloses PWM signal generating circuit technology for generating a high resolution PWM signal in accordance with circuit configurations of a multi-phase-clock generating circuit, a flip-flop circuit (hereinafter, FF), and a logic circuit (XOR circuit). Japanese Patent No. 5491454 discloses a high-speed parallel-to-serial conversion circuit in accordance with circuit configurations of a multi-phase-clock generating circuit, a flip-flop circuit, an SR latch circuit, and an edge detecting circuit.

In a case of a circuit configuration of Japanese Patent Laid-Open No. 2017-38142 that combines a multi-phase clock and a logic circuit (XOR circuit), ideally, the resolution of the PWM output signal is determined by a phase interval of the multi-phase clock. However, in practice, due to PVT (Process, Voltage, Temperature) variation of the logic circuit (XOR circuit), edge variation of the PWM signal and degradation of the PWM resolution occur.

"A" in FIG. 6 shows where a PWM resolution is in an ideal state, and "B" in FIG. 6 shows where a PWM resolution is in a degraded state. For the PWM resolution in the ideal state A of FIG. 6 ($\Delta T/8$), when the edge of the PWM signal varies due to PVT variation, as shown in the deteriorated state B in FIG. 6, it becomes impossible to realize an ideal pulse width.

Further, the logic circuit described in Japanese Patent Laid-Open No. 2017-38142 (XOR circuit) generally has a tendency for the circuit to be complicated as compared with other logic circuits (such as an OR circuit). As an example, FIG. 11A shows a transistor-level circuit diagram corresponding to a typical four-input OR circuit. In addition, FIG. 11B shows a transistor-level circuit diagram corresponding to a four-input XOR circuit. As shown in FIGS. 11A and 11B, the number of gate stages in a logic circuit tends to be relatively large when common XOR circuits (typically standard cells used in circuit designs, etc.) are used. Since PVT variation occurs at each gate, there is a problem that edge variation of the PWM signal occurs when the number of gate stages is increased, and the PWM resolution is deteriorated.

In Japanese Patent No. 5491454, inside a PWM circuit, a signal indicating a phase difference between adjacent multi-phase clocks is generated, and the signal indicating the phase difference is used to perform a parallel-to-serial conversion. With higher resolution, the pulse width of the signal indicating the phase difference becomes very narrow. Such a narrow width signal tends to degrade or disappear in signal quality due to PVT variations. As a result, the PWM signal shown in FIG. 10A should be obtained, but it is possible for waveform deterioration such as pulse disappearance and waveform cracking of the PWM signal as shown in FIG. 10B to occur.

SUMMARY OF THE INVENTION

According to an aspect of the invention, there is provided a PWM outputting circuit operable to, from pattern data represented by a plurality of bits representing a pulse width, generate a pulse width modulation signal represented by one bit, comprising: a multi-phase-clock generating circuit configured to generate a multi-phase clock which is a plurality of clocks of mutually different phases; an edge-pulse generating circuit configured to, from the pattern data that is inputted, detect a bit position of a rising-edge and a bit position of a falling-edge in the pulse width modulation signal, and generate a rising-edge-pulse and a falling-edge-pulse that represent the rising-edge position and the falling-edge position based on the detection; and an SR latch circuit configured to, by the rising-edge-pulse being inputted to a set terminal and the falling-edge-pulse being inputted to a reset terminal, generate and output the pulse width modulation signal.

According to the present invention, it is possible to generate a high-resolution PWM signal that is robust to PVT variation.

Further features of the present invention will become apparent from the following description of exemplary embodiments (with reference to the attached drawings).

BRIEF DESCRIPTION OF THE DRAWINGS

FIG. 1 is a block diagram showing a configuration of a PWM outputting circuit in an embodiment.

FIG. 2 is a block diagram showing a configuration of a PWM outputting circuit in a first embodiment.

FIG. 4 is a timing chart showing a conversion process in an edge detecting circuit of the first embodiment.

FIGS. 7A and 7B are timing charts of FF_G[7:0] of the first embodiment.

FIG. 9 is a timing chart of the edge-pulse generating circuit of the second embodiment.

DESCRIPTION OF THE EMBODIMENTS

Figure 3A:
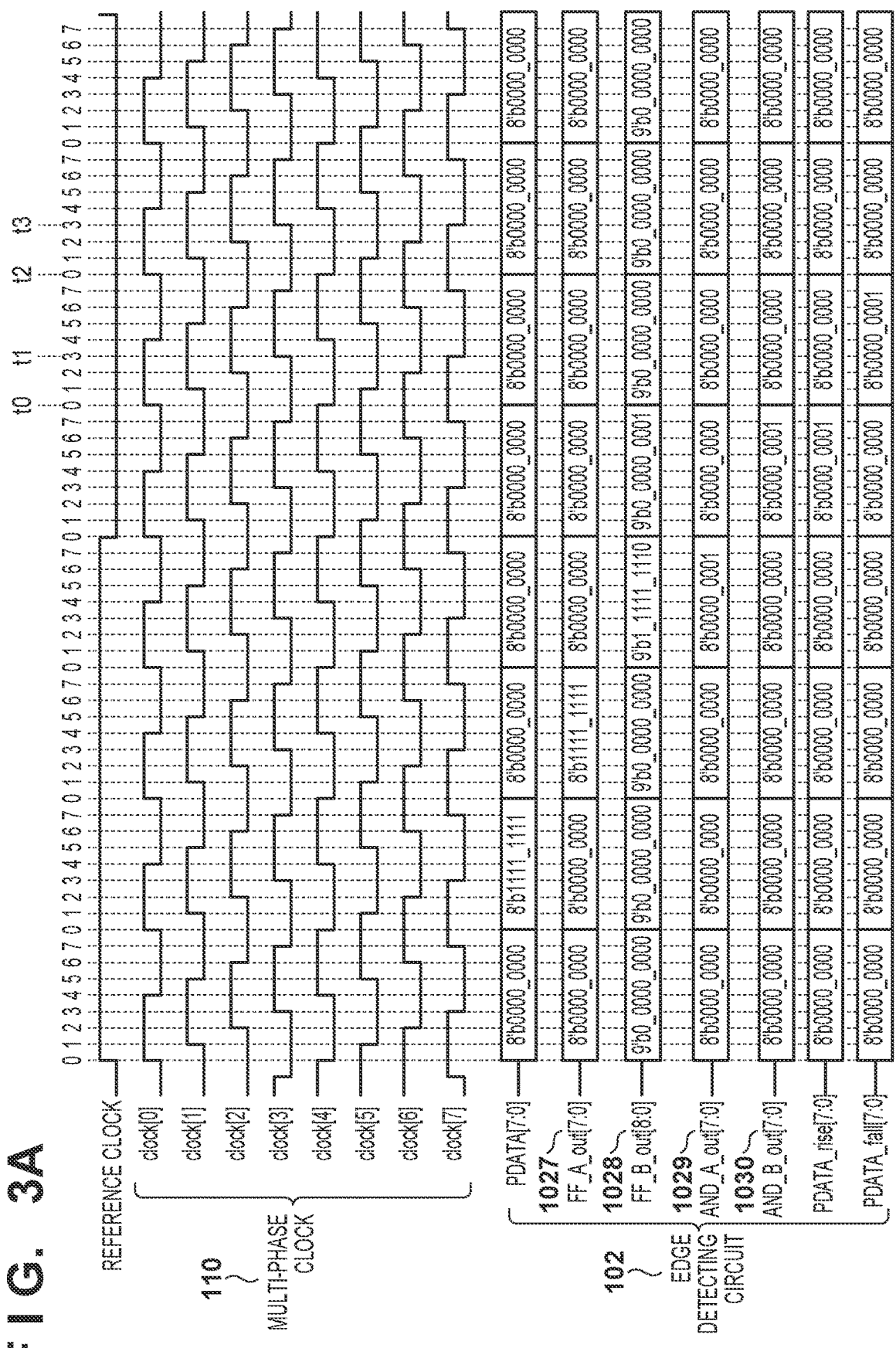
FIGS. 3A and 3B are timing charts of the PWM circuit of the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

Figure 12:
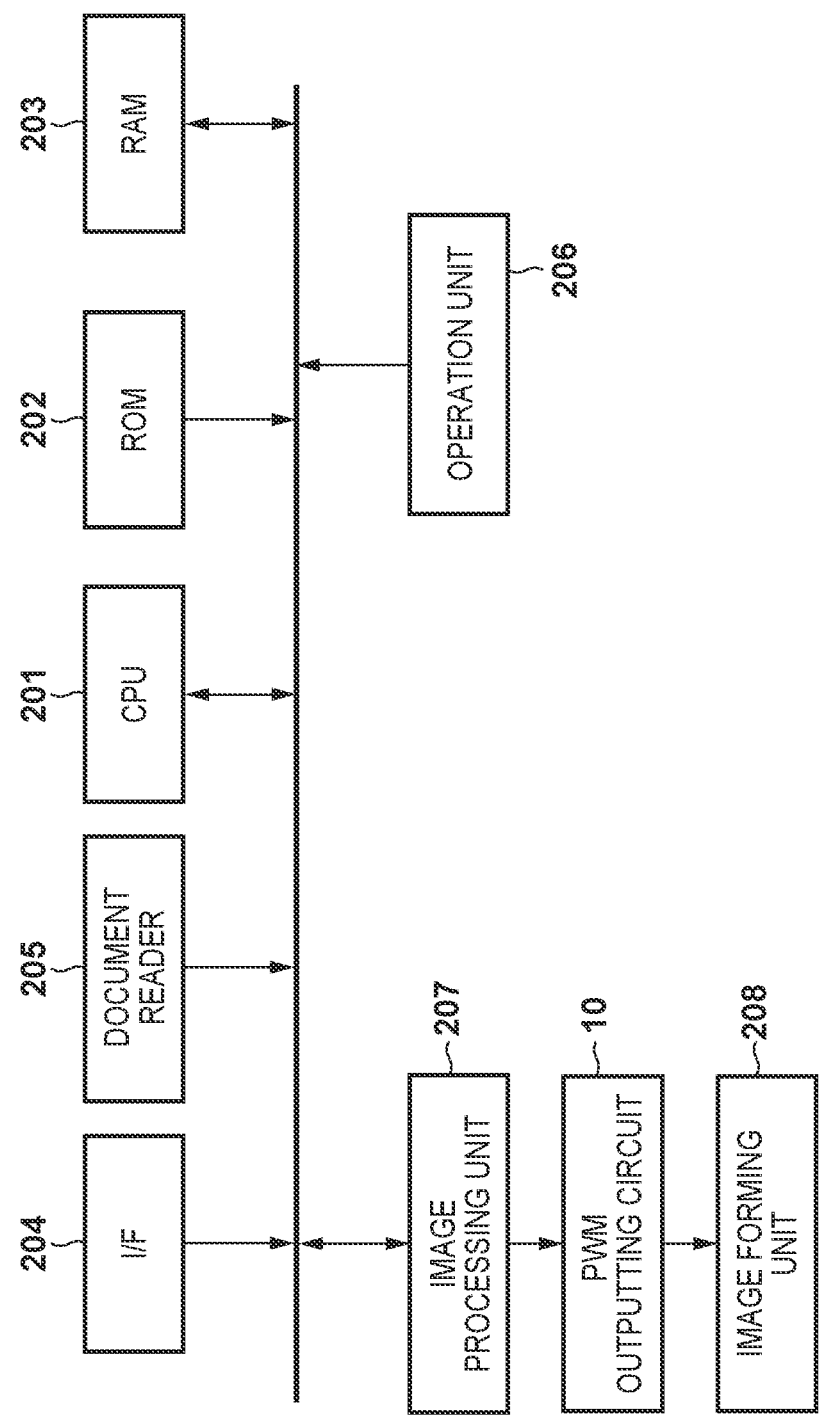
FIG. 12 is a block diagram of an image forming apparatus to which the embodiment is applied.

FIG. 12 is a block diagram of an image forming apparatus to which the embodiment is applied. The image forming apparatus includes a CPU 201, a ROM 202, a RAM 203, an I/F 204, a document reader 205, an operation unit 206, an image processing unit 207, and an image forming unit 208.

A user can input various instructions to the image forming apparatus via the operation unit 206. The CPU 201 executes programs stored in the ROM 202, and uses the RAM 203 as a work area. When printing data is received from the outside via the I/F 204, the CPU 201 temporarily stores the received printing data in the RAM 203 and generates multi-valued image data for printing by performing a drawing process based on the printing data. The CPU 201 outputs the multi-valued image data to the image processing unit 207. When a user inputs an instruction to read a document from the operation unit 206, the CPU 201 controls the document reader 205, reads the document, and temporarily stores the document in the RAM 203. The CPU 201 outputs the read multi-valued image data to the image processing unit 207. The image processing unit 207 converts the input multi-valued image data into multi-valued image data for printing, and outputs the multi-valued image data obtained by the conversion to a PWM outputting circuit 10. The PWM outputting circuit 10, for each pixel of the input multi-valued image data, generates a PWM signal having a time width corresponding to the pixel value of the pixel, and outputs the PWM signal to the image forming unit 208. The image forming unit 208 has a printer engine for forming an image on a recording sheet based on an electrophotographic method. The printer engine in the image forming unit 208 supplies the inputted PWM signal to a laser driver that drives the laser light emitting element. The printer engine performs image formation by performing the steps of sweeping the laser light emitted from the laser light emitting element onto the photosensitive body, developing, and transferring and fixing with respect to the recording sheet. However, since the configuration of the image forming unit 208 is well-known, the details thereof are omitted.

FIG. 1 is a diagram showing a configuration of the PWM outputting circuit 10 in the first embodiment. The PWM outputting circuit 10 is configured by a multi-phase-clock generating circuit 101, an edge detecting circuit 102, an edge-pulse generating circuit 103, and an SR latch circuit 104.

The multi-phase-clock generating circuit 101 generates a multi-phase clock from an inputted reference clock 112. The edge detecting circuit 102 uses a multi-phase clock output from the multi-phase-clock generating circuit 101, to detect a rising-edge and a falling-edge (strictly speaking respective bit positions) of inputted PWM pattern data, and outputs detection results as signals 106 and 107 to the edge-pulse generating circuit 103. The edge-pulse generating circuit 103, using the output of the edge detecting circuit 102 and the multi-phase clock, generates a pulse representing a rising-edge position (Set 108), and a pulse indicating a falling-edge position (Reset 109). Here, the edge-pulse generating circuit 103 is configured from flip-flop circuits (FF) and OR circuits. Then, the SR latch circuit 104 generates serial data (a PWM signal) 111 from the pulse signals Set 108 and Reset 109.

For ease of understanding, in the embodiment, a case of converting 1 GHz 8-bit parallel data 105 to 8 GHz 1-bit serial data is shown. That is, the maximum length of the pulse width represented by the PWM pattern data is 8 bits. Therefore, the multi-phase-clock generating circuit 101 generates 8 phases of 1 GHz (eight clocks). Further, the PWM resolution in the present embodiment is 1 GHz×8=8 GHz.

Further, from the above, the PWM outputting circuit 10 is inputted with PWM pattern data converted from digital data representing pixel values in accordance with a circuit that is not illustrated. The PWM pattern data is 8 bits, and represents a length of 0 to 8 by a consecutive number of bits having a value of "".

Figure 5:
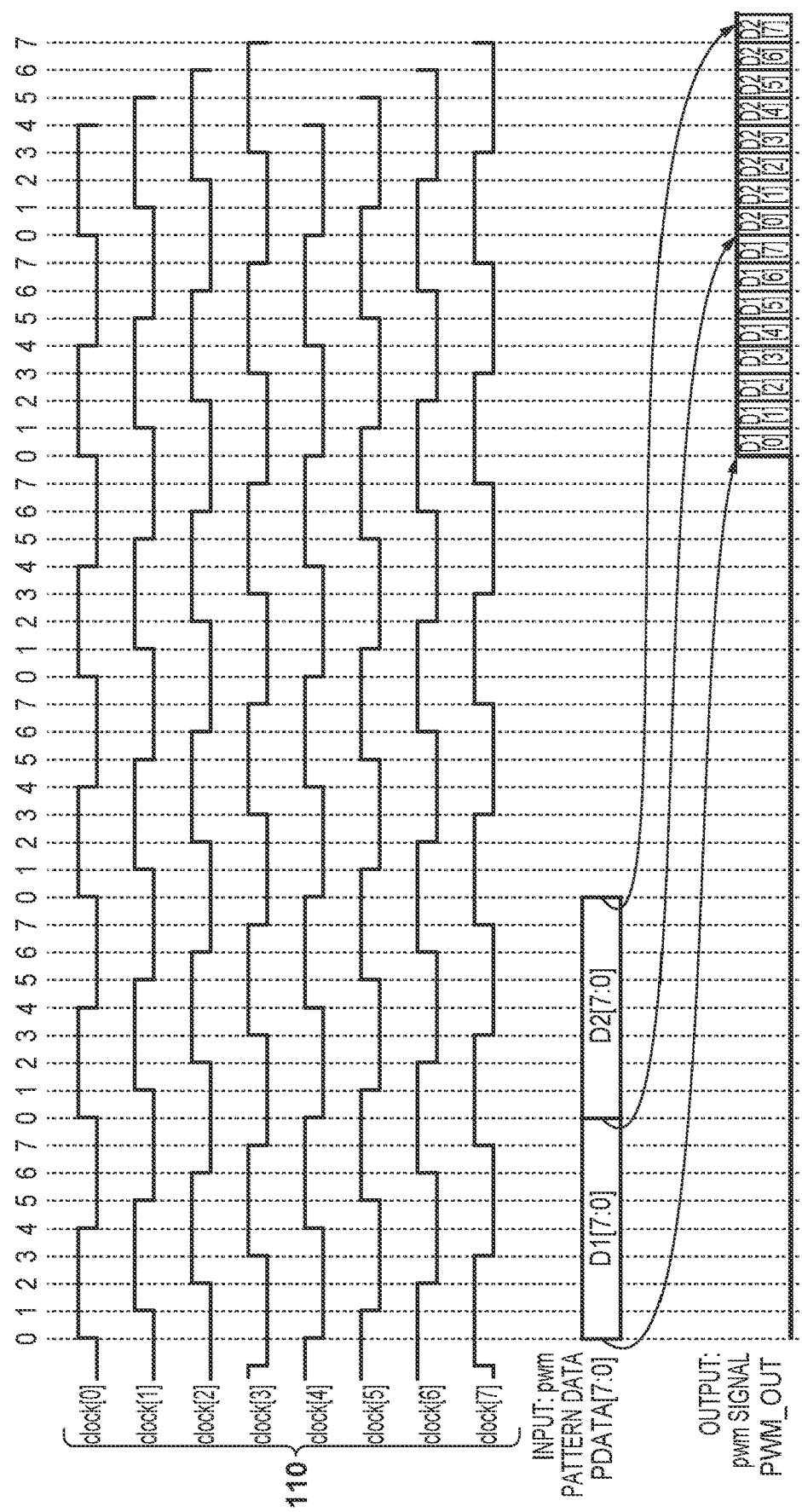
FIG. 5 is a timing chart of inputs and outputs of the PWM outputting circuit of the first embodiment.
Figure 6:
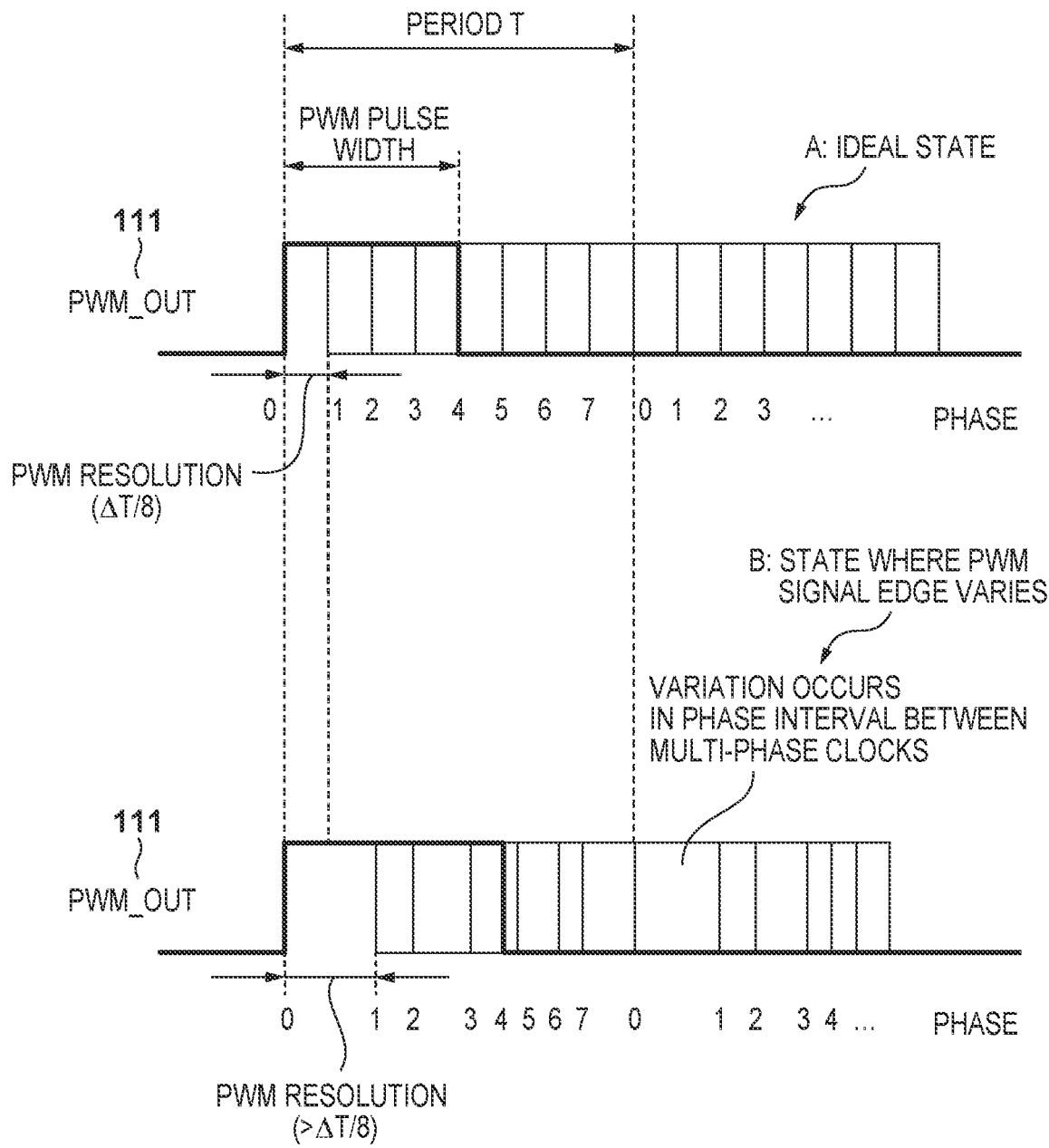
FIG. 6 is a view that shows a state in which the resolution of the PWM signal deteriorates to describe an existing problem.

FIG. 5 is a timing chart of the input and output of the PWM outputting circuit 10. Inputted parallel data (PDATA [7:0]) is converted into serial data (PWM_OUT) in units of phase differences of the multi-phase clock after a predetermined latency (in the present embodiment, after four cycles of the period of the multi-phase clock). In the parallel data (PDATA[7:0]), bit[0] is outputted earlier in time as serial data and bit[7] is outputted later in time as serial data.

Figure 3B:
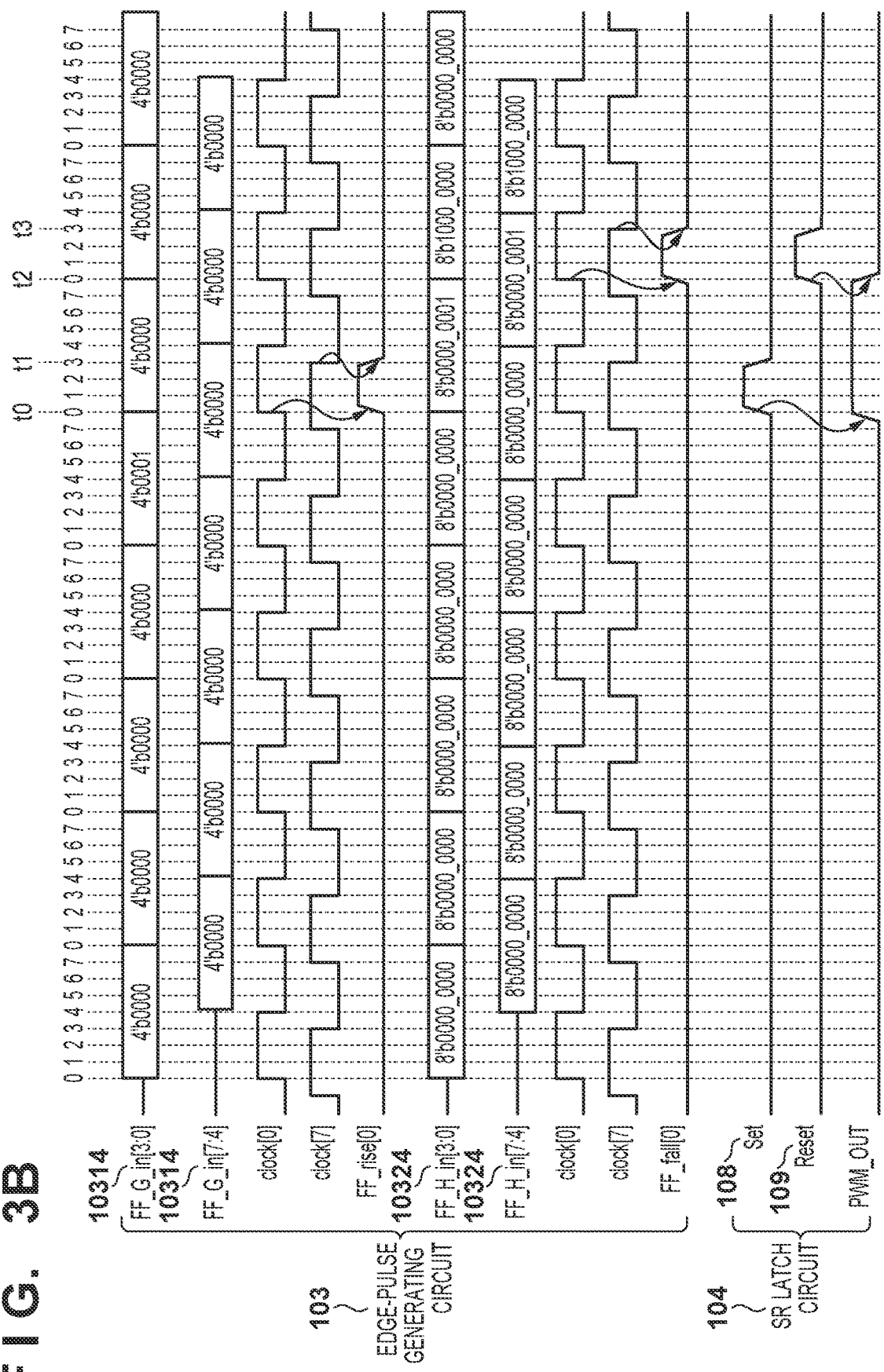

FIG. 2 is a diagram showing a configuration example of the PWM outputting circuit 10 applied to the present embodiment (shows FIG. 1 in detail). FIGS. 3A and 3B shows timing charts for the PWM outputting circuit 10 of the present embodiment. Suffixes "in" and "out" in FIGS. 2, 3A and 3B respectively represent input data (in) and output data (out) of the FF circuits in FIG. 2.

Hereinafter, with reference to FIGS. 2, 3A and 3B, description is given for details of the configuration and operation of the PWM outputting circuit 10 in the embodiment.

Multi-Phase-Clock Generating Circuit 101

[Summary]

A multi-phase-clock generating circuit 101 is configured from a phase comparator 1011, a charge pump 1012, a loop filter 1013, a multi-phase oscillator 1014, and a frequency divider 1015 (see FIG. 2).

The multi-phase-clock generating circuit 101 performs multiplication on the inputted reference clock 112 (1 Ghz in the embodiment), to generate a plurality (eight in the embodiment) of clocks (multi-phase clock 110 in FIG. 3A)

which have the same period and different phases. In the present embodiment, the frequency of the reference clock is 125 MHz, the frequency of the multi-phase clock is 1 GHz, and the number of phases of the multi-phase clock is 8.

[Detailed Description]

Hereinafter, the operation and configuration of the multi-phase-clock generating circuit 101 will be described in detail.

The phase comparator 1011 detects a phase difference between a reference clock signal (reference clock refclock) and a feedback clock signal fbclk. The detected phase difference is inputted to the charge pump 1012, input and output currents according to the phase difference are generated, charging and discharging is controlled by the loop filter 1013.

The multi-phase oscillator 1014 generates a frequency proportional to an output voltage of the loop filter 1013. In such a case, a plurality of clocks (a multi-phase clock) having phases different from each other is generated. In the present embodiment, an eight-phase clock signal clock[7:0] having a phase difference of $\pi/4$ is generated. Of the 8-phase multi-phase clock signal clock[7:0] outputted from the multi-phase oscillator 1014, a clock signal clock[0] of the 0-phase is inputted to the frequency divider 1015.

The frequency divider 1015 divides the inputted clock signal clock[0], and outputs a feedback clock signal fbclk.

The operation of the multi-phase PLL has been described above. Note that various other configurations are conceivable, and the present invention is not limited to the above configuration. The foregoing is to be understood as illustrative only.

Edge Detecting Circuit 102

[Overview]

The edge detecting circuit 102 is configured from an FF_A[7:0] 1023, an FF_B[8:0] 1024, an FF_C[7:0] 1025, an FF_D[7:0] 1026, a rising-edge detecting circuit 1021, and a falling-edge detecting circuit 1022 (see FIG. 2). The edge detecting circuit 102 first synchronizes the PWM pattern data 105 sent from the outside (8 bits) by the clock clock[0], and then converts it from 8 bits to 9 bits. Next, the edge detecting circuit 102, from the 9-bit data, performs rising/falling-edge detection for a PWM pattern represented by the PWM pattern data (detection of the bit position of the edge), synchronizes again at clock[0], and outputs a rising-edge (8 bits) and a falling-edge (8 bits). Edge detection is a process of detecting a change point from consecutive "0"s to "1" (rising-edge) in PWM pattern data and a change point from "1" to "0" (falling-edge) in consecutive data. Then, the edge detecting circuit 102 outputs the change point as "1".

[Detailed Description]

Hereinafter, the operation and configuration of the edge detecting circuit 102 will be described in detail.

First, PDATA[7:0] inputted to the PWM outputting circuit 10 is, in the FF_A[7:0] 1023, synchronized with the rising-edge timing of clock[0], and FF_A_out[7:0] is outputted. That is, FF_A[7:0] 1023 outputs FF_A_out[7:0] 1027 which is delayed by one clock[0] clock cycle with respect to the input of PDATA[7:0].

Next, FF_A_out[7:0] 1027 is converted from 8 bits to 9 bits at FF_B[8:0] 1024 (see FIG. 4). This conversion process is a process of converting the 8 bits of FF_A_out[7:0] to 9 bits obtained by adding 1 bit of FF_A_out[7] one from clock cycle prior to the clock cycle (clock[0]). This processing is boundary processing performed in order to detect an edge of a data boundary straddling cycles in the edge detection processing of the subsequent stage. As shown in FIG. 2, in order to add the data from one cycle ago (FF_A_out[7]), the output of FF_B[8] is connected to the input of FF_B[0], thereby realizing a conversion process. FF_B_out[8:0] 1028 is outputted delayed by one clock[0] cycle with respect to the input of FF_A_out[7:0].

Next, the data of FF_B_out[8:0] 1028 which was converted into 9 bits is inputted to the rising-edge detecting circuit 1021 and the falling-edge detecting circuit 1022. The rising-edge detecting circuit 1021 and the falling-edge detecting circuit 1022, each of which is configured by a combined circuit described later, perform edge detection processing, and generate rising-edge and falling-edge information AND_A_out[7:0] 1029 and AND_B_out[7:0] 1030.

The rising-edge detecting circuit 1021 and the falling-edge detecting circuit 1022 are configured by a combined circuit of a two-input AND gate and an inverter. In both cases, one of the AND gate inputs is inverted by the inverter. Of the two inputs, a data signal that is previous in time is inverted in the rising-edge detecting circuit 1021, whereas a data signal that is later in time out of the two inputs is inverted in the falling-edge detecting circuit 1022 (see FIG. 2).

This makes it possible to detect a timing at which the temporally continuous data changes from "0" to "1" (rising-edge) and a timing at which the temporally continuous data changes from "1" to "0" (falling-edge).

Next, AND_A_out[7:0] 1029, AND_B_out[7:0] 1030 are synchronized with clock[0] at FF_C[7:0] 1025 and FF_D[7:0] 1026, and outputted as PDATA_rise[7:0] 106, PDATA_fall[7:0] 107. PDATA_rise[7:0] 106 is a signal (8-bit signal) that becomes "1" at a timing position (bit position) at which PDATA[7:0] changes from "0" to "1", and is "0" at other positions. PDATA_fall[7:0] 107 is a signal (8-bit signal) that becomes "1" at a timing position at which PDATA[7:0] changes from "1" to "0", and is "0" at other positions (refer to FIGS. 3A and 3B).

Note that, although the FF circuits in the edge detecting circuit 102 all operate at clock[0], they may operate at a clock of another phase.

The FF_A[7:0], FF_C[7:0], FF_D[7:0], FF_G[7:0], and FF_H[7:0] shown in FIG. 2 each have FF circuits corresponding to the number of phases of the multi-phase clock, and in the present embodiment, each is configured by eight FF circuits. FF_B is configured from nine FF circuits, and FF_E and FF_F are configured from four FF circuits.

In the present embodiment, the order in which the inputted parallel data PDATA[7:0] is outputted as a PWM signal is that PDATA[0] is temporally earlier and PDATA[7] is later (see FIG. 5).

In addition, the rising-edge detecting circuit and the falling-edge detecting circuit are each configured from eight AND gates and eight inverters, where eight is the number of phases of the multi-phase clock.

In addition, the edge detecting circuit 102 is a combined circuit (rising-edge detecting circuit 1021 and falling-edge detecting circuit 1022) for edge detection that is between FF_B[8:0] 1024 and FF_C[7:0] 1025 (or FF_D[7:0] 1026). Thus, it is a circuit for digitally detecting edges, and has a structure that is robust to variation and in which waveform deterioration is less likely to occur.

Edge-Pulse Generating Circuit 103

[Overview]

The edge-pulse generating circuit 103 is configured by a rising-edge-pulse generating circuit 1031 and a falling-edge-pulse generating circuit 1032 (see FIG. 2). The rising-edge-pulse generating circuit 1031 and the falling-edge-pulse generating circuit 1032 have different input and output data but have the same circuit configuration inside.

The rising-edge-pulse generating circuit 1031 is configured from FF_E[3:0] 10311, FF_G[3:0] 10312, and an OR (logical OR circuit) 10313. From the inputted rising-edge information (8 bits), the rising-edge-pulse generating circuit 1031 uses a multi-phase clock to generate, in accordance with the FF circuits and the OR circuit, a rising-edge-pulse (1 bit) corresponding to the rising-edge position. The falling-edge-pulse generating circuit 1032 is configured from FF_F[3:0] 10321, FF_H[7:0] 10322, and an OR 10323. From the inputted falling-edge information (8 bits), the falling-edge-pulse generating circuit 1032 uses the multi-phase clock 10314 to generate, in accordance with the FF circuits and the OR circuit, a falling-edge-pulse (1 bit) corresponding to the falling-edge position.

As shown in FIG. 2, multi-phase clocks 10314 and 10324 having shifted phases are inputted to clock terminals and reset terminals of FF_G[7:0] 10312 and FF_H[7:0] 10322. The clock terminals are inputted with the 0th phase, the 1st phase, the 2nd phase, . . . , and the 7th phase in order from the top FF, and the reset terminals are inputted with the 7th phase, the 0th phase, the 1st phase, . . . , and the 6th phase in order from the top FF.

[Detailed Description]

Hereinafter, the operation and configuration of the edge-pulse generating circuit will be described in detail.

First, at FF_E[3:0] 10311 and FF_F[3:0] 10321, timing adjustment of the rising-edge 106 and the falling-edge 107 is performed. FF_E[3:0] 10311 is inputted with the rising-edge 106 (PDATA_rise[7:4]), and outputs it synchronized at the rising timing of clock[4].

This processing delays the PDATA_rise[7:0] by ½ period ($=\pi$) of the clock of the PDATA_rise[7:4]. This adjustment makes it possible to adjust the timing (setup hold time) of the FF_G[7:0] 10312 that operates by a multi-phase clock of a subsequent stage, thereby enabling implementation of a high-speed circuit. Similarly, FF_F[3:0] 10321 is inputted with the falling-edge 107 (PDATA_fall[7:4]), and outputs it synchronized at the rising timing of clock[4].

Next, FF_G[7:0] 10312, which is inputted with the rising-edge PDATA_rise[3:0] and FF_E_out[7:4] to data terminals, captures data at the rising-edge timing of the multi-phase clock clock[7:0] of the clock terminal. A reset is applied at the falling-edge timing of the multi-phase clocks clock[7:0] of the reset terminal (reset at low).

As shown in FIGS. 3A and 3B (edge-pulse generating circuit), first, by FF_G_in[0] being "1" and the clock (clock[0]) of FF_G[0] being at a rising-edge timing at time t0, FF_rise[0] becomes "1".

Figure 7A:
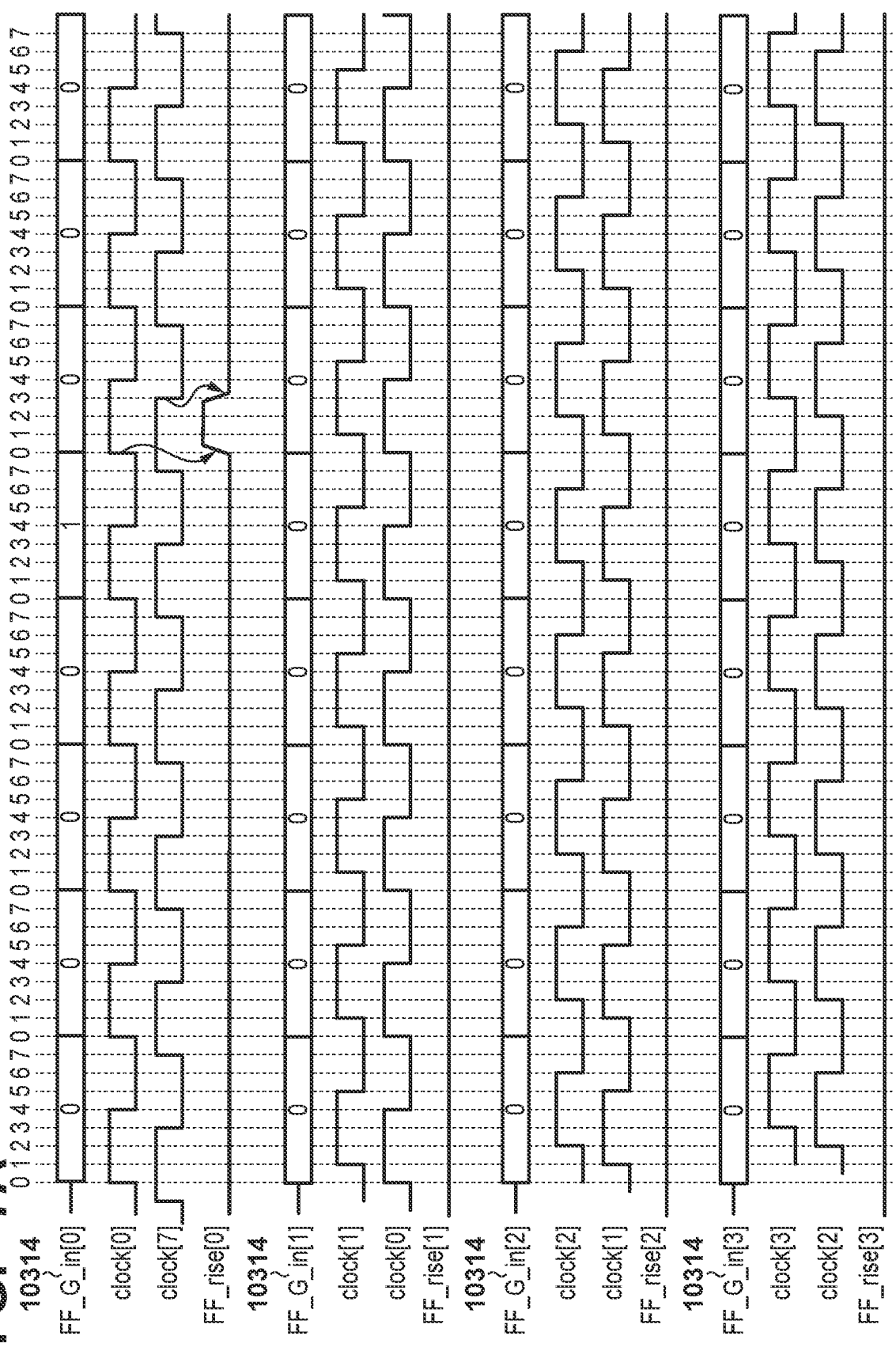

Next, by the reset (clock[7]) of FF_G[0] being at a falling-edge timing (the reset terminal is 0) at time t1, FF_rise[0] becomes "0". As a result, a rising-edge pulse FF_rise[7:0] is generated. A detailed timing relationship of FF_G[7:0] 10312 is shown in FIGS. 7A and 7B.

Thus, by inputting a multi-phase clock with different phases to the clock terminal and the reset terminal of FF_G[7:0] 10312, it is possible to generate a pulse corresponding to the width between the rising-edge and the falling-edge of the reset terminal of the clock terminal (FIGS. 3A and 3B).

Similarly, the FF_H[7:0] 10322 performs the above processing with respect to a falling-edge to generate a pulse (FF_fall[7:0]).

Next, the OR 10313 which is configured by an 8-input OR circuit generates Set 108 which is a rising-edge-pulse by taking a logical OR of FF_rise[7:0] which is an output of FF_G[7:0] 10312 of the preceding stage. If the rising-edge-pulse Set 108 is expressed by an equation, it is the following equation (1):

$$\text{Set } 108 = FF\_rise[0] + FF\_rise[1] + FF\_rise[2] + \ldots + FF\_rise[7] \quad (1)$$

In addition, the OR 10323 which is configured by an 8-input OR circuit generates Reset 109 which is a falling-edge-pulse by taking a logical OR of FF_fall[7:0] which is an output of FF_H[7:0] 10322 of the preceding stage. The falling-edge-pulse Reset 109 can be expressed by the following equation (2):

$$\text{Reset } 109 = FF\_fall[0] + FF\_fall[1] + FF\_fall[2] + \ldots + FF\_fall[7] \quad (2)$$

By the above, a rising-edge-pulse and a falling-edge-pulse are generated by the edge-pulse generating circuit.

SR Latch Circuit 104

[Detailed Description]

The SR latch circuit 104 is configured by two NOR circuits (see FIG. 2).

The inputs of the SR latch circuit 104 are inputted with Set 108 which is a rising-edge-pulse and Reset 109 which is a falling-edge-pulse, and a PWM signal is generated in accordance with normal circuit operation of an SR latch. As shown in FIGS. 3A and 3B (SR latch circuit) a waveform is generated in which, at the rising-edge timing of Set, PWM_OUT rises, and at the rising-edge timing of Reset, PWM_OUT falls.

In a typical SR latch circuit, the output enters an indefinite state when the Set signal and Reset signal which are inputs change from high to low at the same time. However, according to the configuration of the present embodiment, the Set signal and Reset signal do not enter such a state at the same time. This is because the Set signal is a rising-edge of the input image data and the Reset signal Set signal is a falling-edge, the Set signal and the Reset signal does not rise simultaneously, and the pulse widths of the Set signal and the Reset signal are the same. The pulse width of the Set signal and the Reset signal is defined by the phase interval between the clocks inputted to the clock terminals and the reset terminals of the FF circuit, because all have the same phase interval.

According to the configuration of the first embodiment described above, it is possible to generate a PWM signal with small edge variation. Thus, making a PWM signal have high resolution and high linearity is realized. Further, because the PWM output is generated using the phase relationship between the rising-edge and the falling-edge and without using the phase difference signal of the multi-phase clock in the circuit (very narrow pulse signal), a PWM outputting circuit robust to PVT variation is realized. Further, by the present circuit configuration, it is possible to generate a narrow pulse such as a minimum resolution pulse.

Note that the multi-phase-clock generating circuit 101 may have a configuration other than that shown in the present embodiment. For example, in addition to an analogue PLL (Phase Locked Loop), a configuration of a digital PLL, a configuration of a DLL that excludes a PLL, a configuration of a decimal frequency divider which excludes an integer frequency divider, and the like can be given. Further, the multi-phase oscillator 1014 may be realized by an inverter chain type VCO, an LC tank type VCO, or the like.

Generally, instead of the NOR circuit configuration shown in the present embodiment, the SR latch circuit 104 may have another configuration, for example, a NAND circuit configuration.

The clock phase used in each block of the PWM outputting circuit may be an example other than the example shown in the present embodiment. The circuit is implemented by appropriately selecting and adjusting the timing of the phase of the multi-phase clock used in each block.

Second Embodiment

Figure 8:
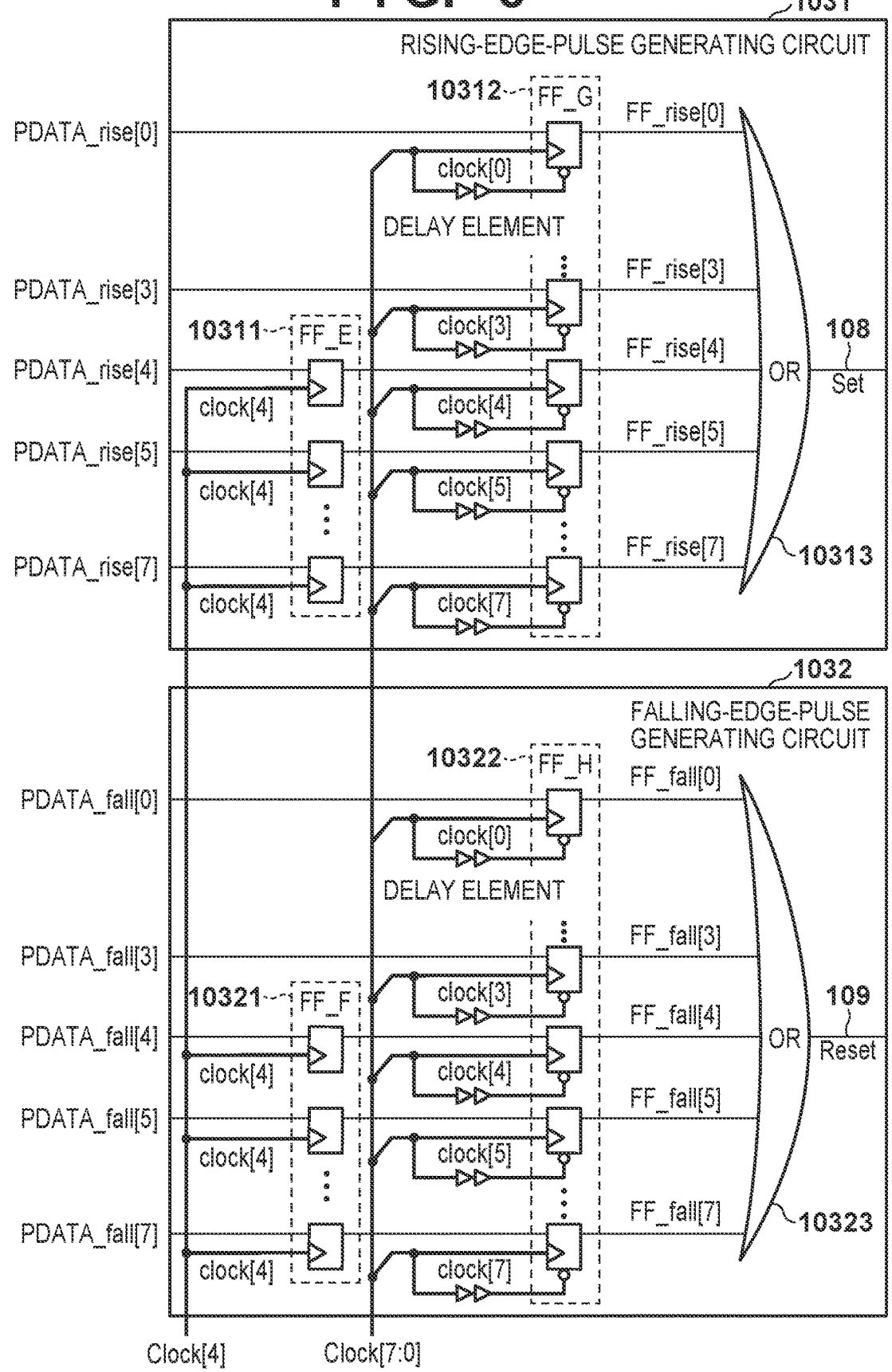
FIG. 8 is a block diagram showing a configuration of an edge-pulse generating circuit of a second embodiment.
Figure 10A:
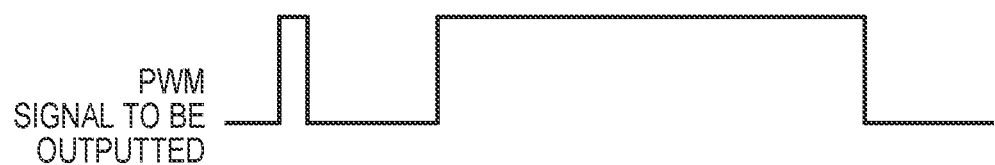
FIGS. 10A and 10B are diagrams showing an example of waveform deterioration to describe an existing problem.
Figure 10B:
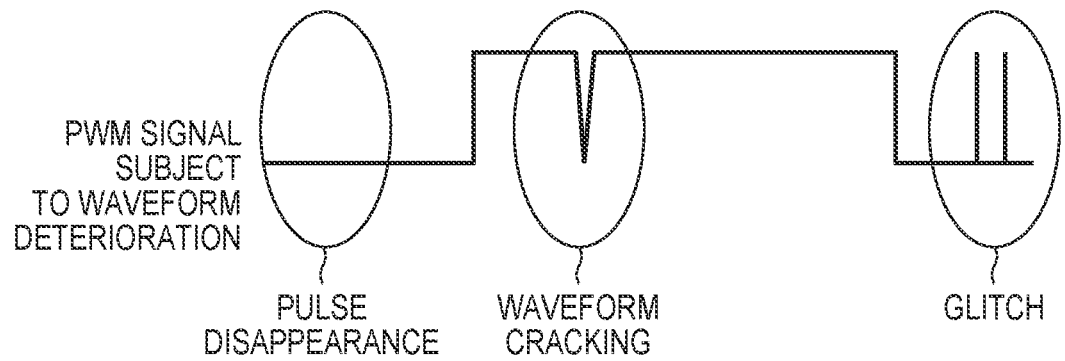
Figure 11B:
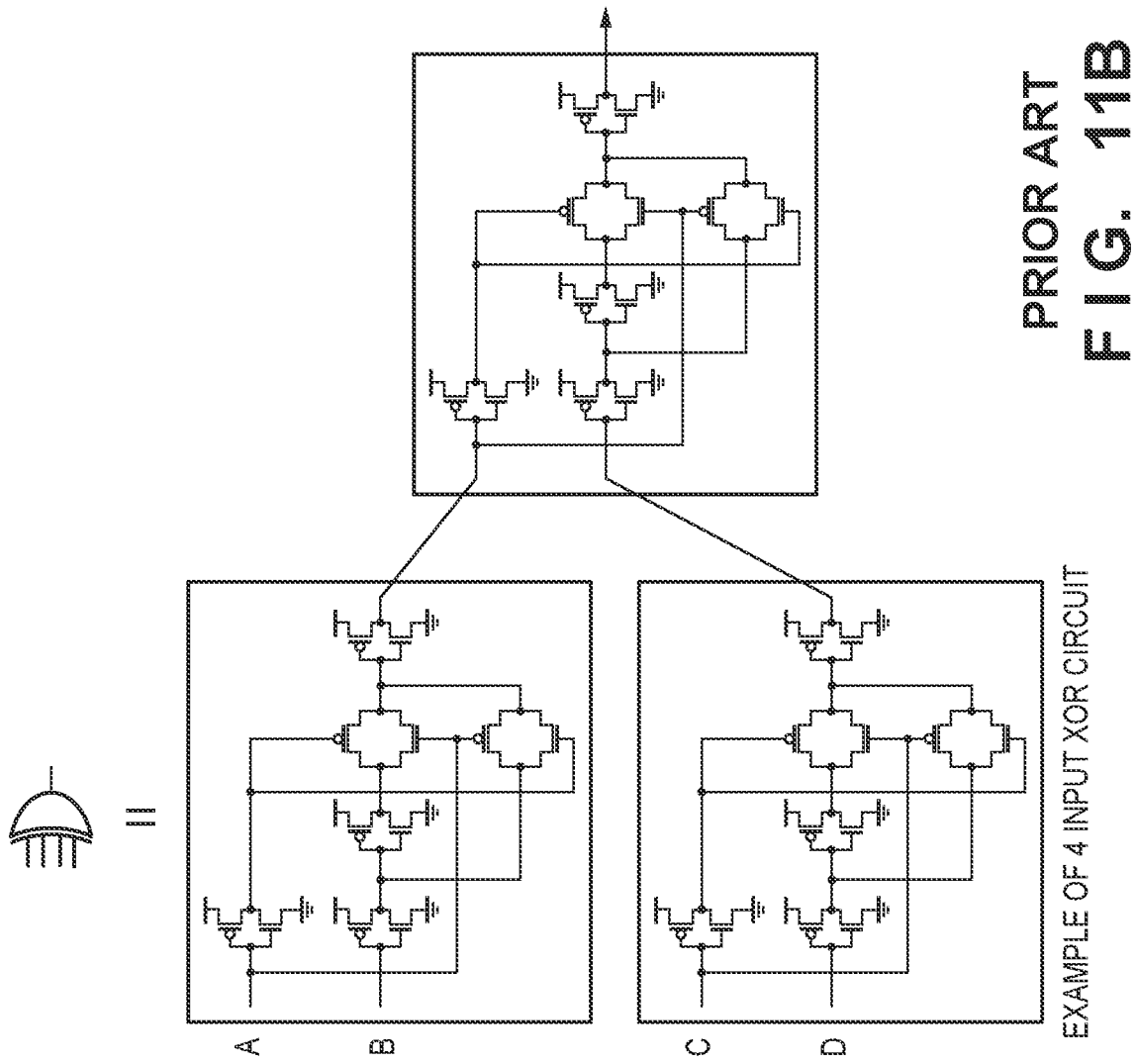
FIGS. 11A and 11B are diagrams showing an example of an OR circuit and an XOR circuit to describe an existing problem.
Figure 11A:
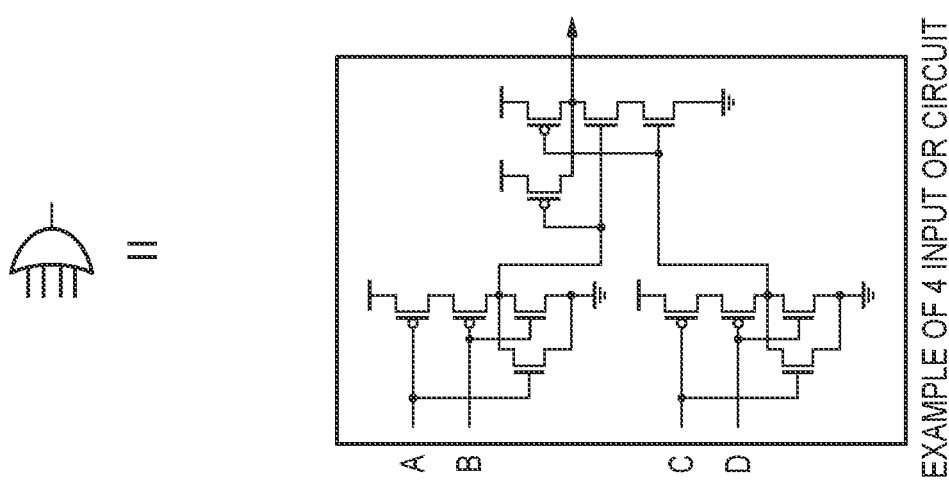

FIG. 8 is a block diagram showing a configuration of the edge-pulse generating circuit 103 of a second embodiment.

For the edge-pulse generating circuit 103 of the second embodiment, the clocks inputted to the reset terminals of FF_G[7:0] 10312 and FF_H[7:0] 10322 are different to those in the first embodiment.

In the first embodiment shown above, from the multi-phase clock of a certain phase inputted to the clock terminal of the FF circuit, the clock of the phase shifted by a predetermined number of phases is inputted to a reset terminal. For example, in the example of the first embodiment, a phase (clock[7]) shifted by seven phases from the clock (clock[0]) inputted to the clock terminal is inputted to a reset terminal.

In the second embodiment, as shown in FIG. 8, by inserting a delay element for shifting the phase of the clock, there is a configuration in which the clock inputted to the clock terminal is delayed and the delayed clock is inputted to the reset terminal. A delay element may be implemented using a buffer circuit, an inverter circuit or the like.

FIG. 9 is a timing chart of the edge-pulse generating circuit 103 of the second embodiment.

A PWM pulse interval of the PWM outputting circuit 10 of the present second embodiment is limited by the pulse width of Reset 109. Therefore, in order to output a signal having a narrow PWM pulse interval (for example, pulses of the minimum resolution interval, or like), it is necessary to adjust the phases to be inputted to the clock terminal and the reset terminal of the FF circuit 10312, 10322.

In the configuration of the first embodiment, since the phase interval of the multi-phase clock inputted to the clock terminal and the reset terminal (e.g., 7 phases) is decided, the pulse width of Reset 109 depends on the frequency of the multi-phase clock. Therefore, in the second embodiment, a feature is a configuration in which, by having a delay amount of a certain time in accordance with the delay element between the clock terminal and the reset terminal, the PWM pulse interval which can be outputted does not depend on the clock frequency.

Therefore, according to the configuration of the second embodiment, since Set 108 and Reset 109 can be produced with a pulse width that is a fixed amount of time regardless of the frequency of the multi-phase clock, it is possible to have a configuration in which the PWM pulse interval that can be outputted does not depend on the clock frequency. As a result, the minimum pulse interval can be set in units of time, and flexible design according to the application becomes possible.

Although embodiments according to the present invention are described above, the present invention is not limited to the PWM outputting circuit shown in the first and second embodiments. For example, the present invention also covers an electrophotographic image forming apparatus that has the above-described PWM outputting circuit and forms an image by scanning a photosensitive body with a light beam generated based on a signal from the PWM outputting circuit.

In the above embodiments, pattern data representing a pulse width is 8 bits, but it is sufficient that a plurality of bits be used, and the number of bits is not particularly limited. If the pattern data representing the pulse width is N bits where N is an integer greater than or equal to 2, configuration may be taken such that the multi-phase-clock generating circuit 101 generates an N-phase clock and the rising-edge-pulse generating circuit and the like have N flip-flops.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-105610, filed Jun. 5, 2019, which is hereby incorporated by reference herein in its entirety.

What is claimed is:

1. A PWM outputting circuit operable to, from pattern data represented by a plurality of bits representing a pulse width, generate a pulse width modulation signal represented by one bit, comprising:
   a multi-phase-clock generating circuit configured to generate a multi-phase clock which is a plurality of clocks of mutually different phases;
   an edge-pulse generating circuit configured to, from the pattern data that is inputted, detect a bit position of a rising-edge and a bit position of a falling-edge in the pulse width modulation signal, and generate a rising-edge-pulse and a falling-edge-pulse that represent the rising-edge position and the falling-edge position based on the detection; and
   an SR latch circuit configured to, by the rising-edge-pulse being inputted to a set terminal and the falling-edge-pulse being inputted to a reset terminal, generate and output the pulse width modulation signal.

2. The circuit according to claim 1, wherein when a maximum length of the pulse width modulation signal is represented by N bits and the multi-phase-clock generating circuit generates an N-phase clock, wherein edge-pulse generating circuit has:
an edge detecting circuit configured to generate from the pattern data N bits of rising-edge data in which a value of a bit position representing the rising-edge position is set to "1" and other bits are set to "0", and generate from the pattern data N bits of falling-edge data in which a value of a bit position representing the falling-edge position is set to "1" and other bits are set to "0",
a first edge-pulse generating circuit having N flip-flops to be inputted with respective bits of the N-phase clock from the multi-phase-clock generating circuit and the rising-edge data and a logical OR circuit for obtaining a signal resulting from a logical OR of output from the N flip-flops, and configured to generate a signal of 1 bit obtained by the logical OR circuit as the rising-edge-pulse, and
a second edge-pulse generating circuit having N flip-flops to be inputted with respective bits of the N-phase clock from the multi-phase-clock generating circuit and the falling-edge data and a logical OR circuit for obtaining a signal resulting from a logical OR of output from the N flip-flops, and configured to generate a signal of 1 bit obtained by the logical OR circuit as the falling-edge-pulse.

3. The circuit according to claim 2, wherein, for each of the N flip-flops held in the first and second edge-pulse generating circuit, two clocks of adjacent phases from the multi-phase-clock generating circuit are inputted to a clock terminal and a reset terminal, and one bit of the rising-edge data or the falling-edge data is latched.

4. The circuit according to claim 2, wherein, for each of the N flip-flops held in the first and second edge-pulse generating circuit, one clock from the multi-phase-clock generating circuit and a clock resulting from delaying this one clock are inputted to a clock terminal and a reset terminal, and one bit of the rising-edge data or the falling-edge data is latched.

5. The circuit according to claim 2, wherein
the first edge-pulse generating circuit outputs the generated rising-edge-pulse to the set terminal, and
the second edge-pulse generating circuit outputs the generated falling-edge-pulse to the reset terminal.

6. An image forming apparatus comprising:
a PWM outputting circuit configured to, from pattern data represented by a plurality of bits representing a pulse width, generate a pulse width modulation signal represented by one bit;
an image forming unit configured to form an image by scanning a light beam generated on the basis of a signal from the PWM outputting circuit onto a photosensitive body,
wherein the PWM outputting circuit comprises:
a multi-phase-clock generating circuit configured to generate a multi-phase clock which is a plurality of clocks of mutually different phases;
an edge-pulse generating circuit configured to, from the pattern data that is inputted, detect a bit position of a rising-edge and a bit position of a falling-edge in the pulse width modulation signal, and generate a rising-edge-pulse and a falling-edge-pulse that represent the rising-edge position and the falling-edge position based on the detection; and
an SR latch circuit configured to, by the rising-edge-pulse being inputted to a set terminal and the falling-edge-pulse being inputted to a reset terminal, generate and output the pulse width modulation signal.

7. The image forming apparatus according to claim 6, wherein when a maximum length of the pulse width modulation signal is represented by N bits and the multi-phase-clock generating circuit generates an N-phase clock, wherein edge-pulse generating circuit has:
an edge detecting circuit configured to generate from the pattern data N bits of rising-edge data in which a value of a bit position representing the rising-edge position is set to "1" and other bits are set to "0", and generate from the pattern data N bits of falling-edge data in which a value of a bit position representing the falling-edge position is set to "1" and other bits are set to "0",
a first edge-pulse generating circuit having N flip-flops to be inputted with respective bits of the N-phase clock from the multi-phase-clock generating circuit and the rising-edge data and a logical OR circuit for obtaining a signal resulting from a logical OR of output from the N flip-flops, and configured to generate a signal of 1 bit obtained by the logical OR circuit as the rising-edge-pulse, and
a second edge-pulse generating circuit having N flip-flops to be inputted with respective bits of the N-phase clock from the multi-phase-clock generating circuit and the falling-edge data and a logical OR circuit for obtaining a signal resulting from a logical OR of output from the N flip-flops, and configured to generate a signal of 1 bit obtained by the logical OR circuit as the falling-edge-pulse.

8. The image forming apparatus according to claim 6, wherein, for each of the N flip-flops held in the first and second edge-pulse generating circuit, two clocks of adjacent phases from the multi-phase-clock generating circuit are inputted to a clock terminal and a reset terminal, and one bit of the rising-edge data or the falling-edge data is latched.

9. The image forming apparatus according to claim 6, wherein, for each of the N flip-flops held in the first and second edge-pulse generating circuit, one clock from the multi-phase-clock generating circuit and a clock resulting from delaying this one clock are inputted to a clock terminal and a reset terminal, and one bit of the rising-edge data or the falling-edge data is latched.

10. The image forming apparatus according to claim 6, wherein
the first edge-pulse generating circuit outputs the generated rising-edge-pulse to the set terminal, and
the second edge-pulse generating circuit outputs the generated falling-edge-pulse to the set terminal.

* * * * *